United States Patent
Yu

(10) Patent No.: US 6,320,228 B1
(45) Date of Patent: Nov. 20, 2001

(54) MULTIPLE ACTIVE LAYER INTEGRATED CIRCUIT AND A METHOD OF MAKING SUCH A CIRCUIT

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/483,678

(22) Filed: Jan. 14, 2000

(51) Int. Cl.[7] .......................... H01L 27/01; H01L 27/12; H01L 31/0392

(52) U.S. Cl. ................................ 257/350; 257/74

(58) Field of Search .................. 257/67, 70, 74, 257/349, 350

(56) References Cited

U.S. PATENT DOCUMENTS

| | | |
|---|---|---|
| 4,996,574 | 2/1991 | Shirasaki . |
| 5,120,666 | 6/1992 | Gotou . |
| 5,202,754 | 4/1993 | Bertin et al. . |
| 5,321,286 | 6/1994 | Koyama et al. . |
| 5,346,834 | 9/1994 | Hisamoto et al. . |
| 5,420,048 | 5/1995 | Kondo . |
| 5,442,222 * | 8/1995 | Takasu ................................ 257/506 |
| 5,451,798 | 9/1995 | Tsuda et al. . |
| 5,481,133 | 1/1996 | Hsu . |
| 5,482,877 | 1/1996 | Rhee . |
| 5,497,019 | 3/1996 | Mayer et al. . |
| 5,581,101 | 12/1996 | Ning et al. . |
| 5,612,546 | 3/1997 | Choi et al. . |
| 5,612,552 * | 3/1997 | Owens ................................ 257/202 |
| 5,675,185 | 10/1997 | Chen et al. . |
| 5,689,136 | 11/1997 | Usami et al. . |
| 5,936,280 | 8/1999 | Liu . |
| 6,031,269 | 2/2000 | Liu . |

FOREIGN PATENT DOCUMENTS

| | | |
|---|---|---|
| 61-180466 | 8/1986 | (JP) . |
| 3/288471 | 12/1991 | (JP) . |
| 4-240762 | 8/1992 | (JP) . |

OTHER PUBLICATIONS

Auberton–Herve "SMART–CUT®: The Basic Fabrication Process for UNIBOND® SOI Wafers" Mar. 1997.

International Elecontric Devices Meeting 1997, Sub–100nm Gate Length Metal Gate NMOS Transistors Fabricated by a Replacement Gate Process.

* cited by examiner

Primary Examiner—Ngân V. Ngô
(74) Attorney, Agent, or Firm—Foley & Lardner

(57) ABSTRACT

An integrated circuit includes multiple active layers. Preferably, a semiconductor-on-insulator (SOI) or silicon-on-insulator wafer is utilized to house a first active layer. A second active layer is provided by bonding a bulk substrate to the SOI substrate and removing the bulk substrate to leave a thin semiconductor layer. Subsequent active layers can be added by a similar technique. Preferably, the bulk substrates utilize a hydrogen implant to provide a breaking interface.

20 Claims, 3 Drawing Sheets

MULTIPLE ACTIVE LAYER INTEGRATED CIRCUIT AND A METHOD OF MAKING SUCH A CIRCUIT

CROSS REFERENCE TO RELATED APPLICATIONS

The present application is related to U.S. Pat. No. 5,889,302 issued Mar. 30, 1999 by Liu entitled "Multilayer Floating Gate Filed Effect Transistor Structure for use in Integrated Circuit Devices"; U.S. Pat. No. 6,031,269, issued on Feb. 29, 2000, by Liu entitled "Quadruple Gate Field Effect Transistor Structure for Use in Integrated Circuit Devices"; and U.S. Pat. No. 5,936,280, issued on Aug. 10, 1999 by Liu entitled "Multilayer Quadruple Gate Filed Effect Transistor Structure for Use in Integrated Circuit Devices". All of which are assigned to the assignee of the present application.

FIELD OF THE INVENTION

The present invention relates to integrated circuit devices. More particularly, the present invention relates to a multiple active layer integrated circuit structure and a method of manufacturing such a structure.

BACKGROUND OF THE INVENTION

Semiconductor devices, such as, processors, non-volatile memory, and other circuits include semiconductor elements, such as, metal oxide semiconductor field effect transistors (MOSFETS), diodes, resistors, and capacitors. For example, flash memory devices employ millions floating gate FETs and processors employ millions of complementary MOSFETS. MOSFETS are generally disposed in active regions disposed in a base layer or substrate. Active regions typically include heavily doped silicon or other semiconductor regions. The regions can be doped with impurities, such as, phosphorous (P), boron (B), arsenic (As), or other material.

Semiconductor elements, such as, floating gate transistors and FETS, are generally bulk semiconductor-type devices in contrast to semiconductor-on-insulator-type devices, such as, silicon-on-insulator (SOI) devices. The floating gate transistors and FETs are disposed in a single plane (single active layer) on a top surface of a semiconductor substrate, such as, a single crystal silicon substrate.

In bulk semiconductor-type devices which have lateral FETs, the top surface of the substrate is doped to form source and drain regions, and a conductive layer is provided on the top surface of the semiconductor substrate between the source and drain regions to operate as a gate. In floating gate FETS, the gate is provided over a floating gate. The number of layers of lateral FETs is limited to one layer (e.g., the top surface) because only one active region is available in conventional planar processes. Additionally, the anisotropic nature of the top surface of the silicon substrate due to the conductive layer limits the number of metal layers and insulative layers which can be provided over the lateral FETs. Thus, in bulk semiconductor type devices, circuit density is limited by the integration density of electrical components on the surface of the wafer (substrate).

The use of only a single active layer can waste valuable silicon material. Bulk-type semiconductor devices utilizing multiple layers have been proposed to reduce the cost of integrated circuits and more efficiently utilize substrate area. These proposed devices utilize seeded epitaxial layers or recrystalized amorphous silicon layers to form multiple layers.

Bulk semiconductor-type devices can be subject to some disadvantageous properties, such as, less than ideal subthreshold voltage slope during operation, high junction capacitance, and ineffective isolation. Additionally, bulk semiconductor-type devices often require epilayers, P-wells, or N-wells which require additional fabrication steps.

Semiconductor-on-insulator (SOI) (e.g., silicon-on-insulator) devices have significant advantages over bulk semiconductor-type devices, including near ideal subthreshold voltage slope, elimination of latch-up, low junction capacitance, and effective isolation between devices. SOI-type devices generally completely surround a silicon or other semiconductor substrate with an insulator. Devices, such as, conventional FETs or other transistors, are disposed on the silicon by doping source and drain regions and by providing gate conductors between the source and drain regions. SOI devices provide significant advantages, including reduced chip size or increased chip density because minimal device separation is needed due to the surrounding insulating layers. Additionally, SOI devices can operate at increased speeds due to reduction in parasitic capacitance. These advantages are particularly important as integration technologies reach sub-100 nanometer levels for CMOS devices.

Conventional SOI devices generally have a floating substrate (the substrate is often totally isolated by insulating layers). Accordingly, SOI devices are subject to floating substrate effects, including current and voltage kinks, thermal degradation and large threshold voltage variations. SOI devices also can have some limited packing densities because they are limited in vertical integration. Generally, SOI devices can include a very thin (200–800 Å thick) silicon film separated from a bulk substrate by a thick buried oxide (2000–3000 Å thick). However, the thin silicon film is generally the only active layer.

SOI devices utilizing multiple layers have also been proposed. Multiple layers in these devices are achieved by stacking SOI wafers on top of each other.

Thus, there is a need for an SOI or bulk semiconductor device which has improved density and improved vertical integration. Further, there is a need for an SOI device which includes more than one active layer. Further still, there is a need for method of manufacturing an SOI or bulk semiconductor device including more than one active layer. Yet further, there is a need for a multi-layer device which has some of the advantages of SOI devices without utilizing multiple SOI wafers.

SUMMARY OF THE INVENTION

An exemplary embodiment relates to an integrated circuit. The integrated circuit includes a first semiconductor-on-insulator layer which includes a first active layer, a second active layer, and a third insulating layer. The first semiconductor-on-insulator layer also includes a first insulator layer and a second insulating layer. The first active layer contains a first channel region, and the second active layer includes a second channel region. The second active layer is attached to the second insulating layer, and the third insulating layer is disposed above the second active layer.

Another embodiment relates to a multi-layer structure for containing a plurality of transistors. The multi-layer structure includes a first layer which includes a first semiconductor substrate, a buried oxide layer, and a first active layer. The multilayer structure also includes an insulation layer and a second active layer disposed above the first active layer. The first active layer is disposed below the first insulating layer. The second active layer is bonded to the first insulating layer.

Yet another embodiment relates a method of making a multilayer structure for containing a plurality of transistors. The method includes providing a first layer, attaching a second semiconductor substrate, separating the semiconductor substrate, and doping the second semiconductor substrate to form an active layer. The first layer includes a first semiconductor substrate, a buried oxide layer, and a first active layer. A first insulating layer is provided over the first active layer. The second semiconductor substrate is attached to the first insulating layer. The second semiconductor substrate is separated from the first insulating layer to leave a portion of the second semiconductor substrate attached to the first layer. The portion of the second semiconductor substrate is doped to form the second active layer.

BRIEF DESCRIPTION OF THE DRAWINGS

Preferred embodiments will hereinafter be described in conjunction with the appended drawings, wherein like numerals denote like elements.

DETAILED DESCRIPTION OF THE PREFERRED EMBODIMENTS

Figure 1:
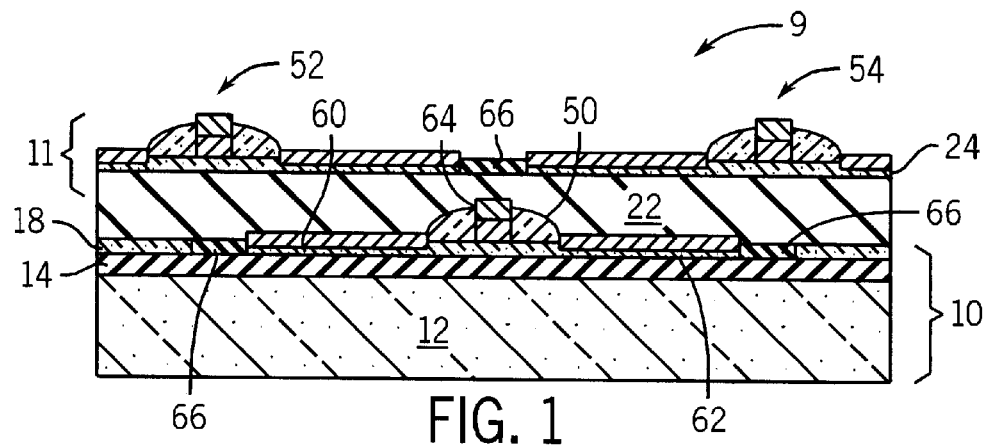
FIG. 1 is a cross-sectional view of an integrated circuit including two active layers in accordance with an exemplary embodiment.

With reference to FIG. 1, a multilayer integrated circuit 9 includes a first integrated circuit 10 and a second integrated circuit 11. Circuit 10 is preferably a first semiconductor-on-insulator (SOI) layer, and circuit 11 is preferably a second layer. A first integrated circuit 10 is stacked below second integrated circuit 11. Circuit 11 can be built on a bulk substrate or a SOI substrate.

Circuit 10 includes a support substrate 12, an insulating layer 14, an active layer or a semiconductor substrate 18, and an insulating layer 22. Circuit 10 is a SOI-based layer, substrate or platform.

Support substrate 12 is preferably a semiconductor material. Support substrate 12 can also be an insulating material or other base layer for integrated circuit 10. Support substrate 12 can be silicon dioxide, silicon, polyester, or a flexible material. Insulating layer 14 is preferably a buried oxide layer, such as silicon dioxide, disposed between substrate 18 and substrate 12.

Active layer or semiconductor substrate 18 is preferably a very thin silicon film separated from support substrate 12 by a thick insulating layer 14. Preferably, semiconductor substrate 18 is 200–800 angstroms thick and insulating layer 14 is 2,000–3,000 angstroms thick.

Insulating layers 14 and 22 can be any dielectric or insulating material. Preferably, layer 22 is a deposited high-temperature oxide, such as, tetraethyl silicate TEOS-based oxide, silicon dioxide, spin-on-glass (SOG), PECVDTEOS oxide, SiH-based, PECVD oxide, or a two-layer glass and nitride material. Layer 14 can be formed similar to layer 22. Alternatively, layer 14 can be formed via an oxygen ion implantation process.

Semiconductor substrate 18 preferably includes active regions, such as doped regions utilized in the formation of transistors, such as, transistor 50. Doped regions in substrate 18 can include a source region 60 and a drain region 62. Transistor 50 can include a gate structure 64 with spacers, a gate oxide, and a polysilicon conductor. Gate structure 64, source 60 and drain 62 can be silicided in accordance with conventional fabrication techniques.

Semiconductor substrate 18 includes isolation regions 66 which separate active regions for transistors on substrate 18. Isolation regions 66 can be insulating regions, such as, silicon dioxide regions formed in conventional local oxidation of silicon (LOCOS) processes. Alternatively, regions 66 can be formed in a shallow trench isolation (STI) process. Circuit 10 can include any number and type of semiconductor elements in and above layer 18.

Integrated circuit 11 is shown including an active layer or semiconductor substrate 24. Semiconductor substrate 24 is similar to semiconductor substrate 18 and houses transistors 52 and 54. Therefore, circuit 9 includes multiple active layers which house semiconductor elements, such as, transistors 50, 52, and 54 on two separate active layers, such as, substrates 18 and 24.

Transistors 52 and 54 are similar to transistor 50. Transistors 50, 52 and 54 can be any type of semiconductor elements including CMOS FETS, FETS, diodes, floating gate transistors, resistors, or other devices which utilize active regions. Substrate 24 also includes isolation region 66 which separate transistors 52 and 54. Substrate 24 is preferably doped to form active regions associated with transistors 52 and 54. Substrate 24 is attached by an adhesive bond to layer 22 of circuit 10. An insulating layer similar to layer 22 can be provided above circuit 11. In addition, metal layers or conductive layers can be provided over the insulating layer above layer 24. The metal layers can include vias for connecting circuitry between circuits 10 and 11. The vias can extend from multiple metal layers to substrates 18 and 24.

Figure 2:
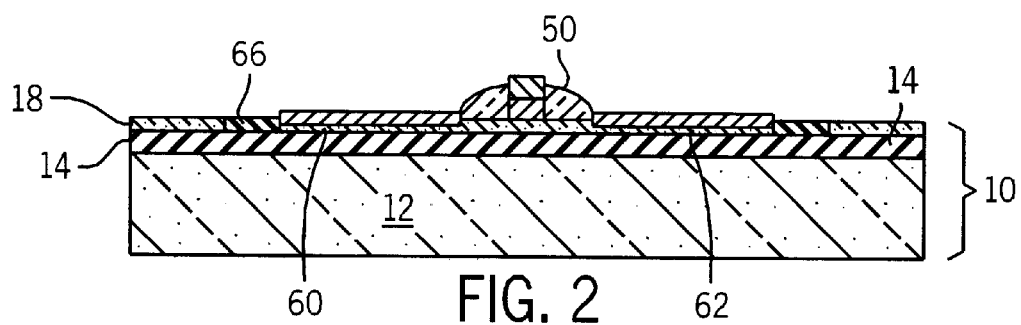
FIG. 2 is a cross-sectional view of a silicon-on-insulator (SOI) substrate including an active layer, the SOI substrate is utilized to manufacture the integrated circuit illustrated in FIG. 1.

With reference to FIGS. 1–7, the manufacture of integrated circuit 9 is discussed below. In FIG. 2, integrated circuit 10 is disposed on an SOI substrate and includes active layer 18 and transistor 50. Transistor 50 can be fabricated on substrate 18 in accordance with any number of conventional transistor fabrication techniques.

Substrate 12, buried oxide 14 and substrate 18 can be part of a silicon-on-insulator (SOI) wafer. Such a wafer can be purchased from a variety of sources, or can be manufactured by implanting oxygen into a bulk semiconductor substrate. In addition, the SOI wafer can be formed by placing an epitaxial silicon layer on top of an insulation layer.

Figure 3:
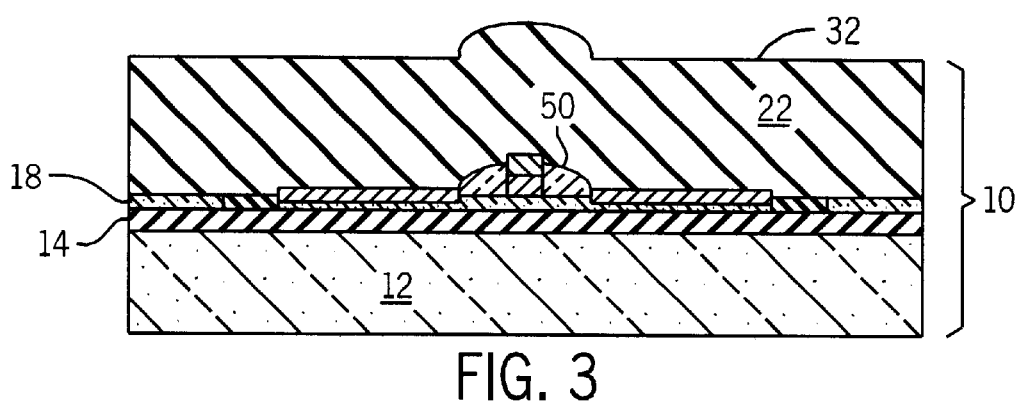
FIG. 3 is a cross-sectional view of the SOI substrate illustrated in FIG. 2, showing an insulating layer deposition step.

In FIG. 3, insulation layer 22 is deposited above transistor 50 and substrate 18. Layer 22 is preferably deposited after transistor 50 is completed on top of and within substrate 18. Layer 22 can be a 4,000–5,000 angstrom thick silicon dioxide deposited in a TEOS-based chemical vapor deposition process.

Figure 4:
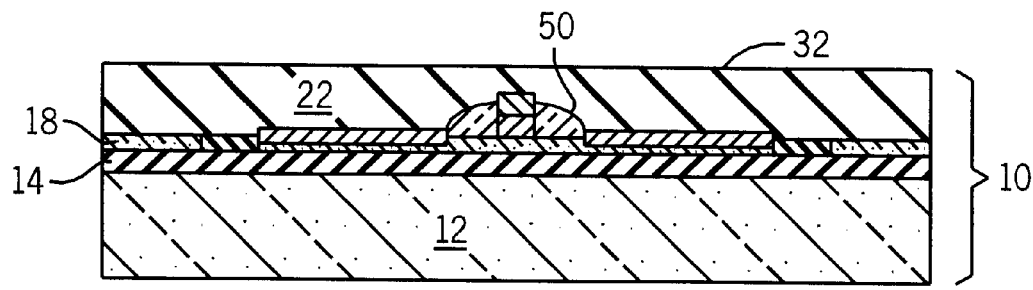
FIG. 4 is a cross-sectional view of the SOI substrate illustrated in FIG. 3, showing a polishing step.

In FIG. 4, insulating layer 22 is polished to remove approximately 2,000 angstroms of material. Preferably, layer 22 is etched to leave approximately 2,000–3,000 angstroms of material having a planar top surface 32. Layer 22 can be polished in a chemical mechanical polish (CMP) process. After polishing, layer 22 can be subjected to a chemical etch to remove an additional 50 angstroms of material. The chemical etch enhances the smoothness of surface 32.

Figure 5:
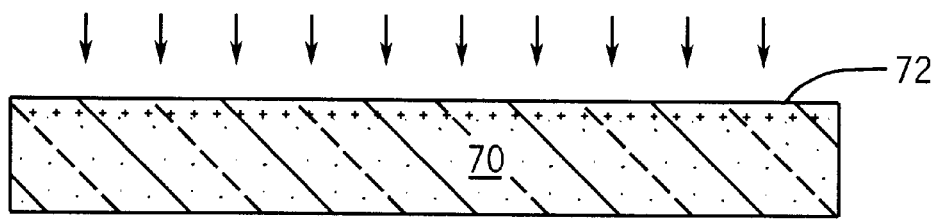
FIG. 5 is a cross-sectional view of a bulk-type substrate which is utilized to manufacture the integrated circuit illustrated in FIG. 1.

In FIG. 5, a substrate 70 is utilized to manufacture integrated circuit 11. Substrate 70 is preferably a bulk semiconductor wafer, such as, a bulktype single crystal silicon wafer. Substrate 70 can be a bulk silicon wafer.

Substrate 70 is subjected to a hydrogen ion (H+) implant. The hydrogen ion implant provides a hydrogen rich layer at a depth of approximately 200–1,000 angstroms below a top surface 72 of substrate 70. An ion implant device manufactured by Varian or Applied Materials can be utilized.

The hydrogen rich layer serves as a breaking interface for subsequent process steps. The depth of the hydrogen implant serves to define the thickness of substrate 24 (FIG. 1). After the hydrogen implant, top surface 78 is preferably subjected to a planarization technique, such as, a CMP process to smooth surface 72.

Figure 6:
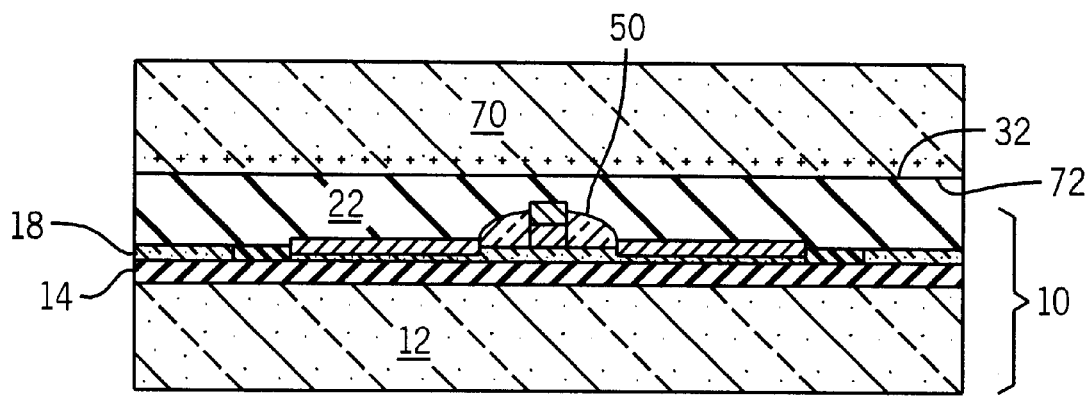
FIG. 6 is a cross-sectional view of the integrated circuit illustrated in FIG. 1 after the bulk-type substrate illustrated in FIG. 5 is joined to the SOI substrate illustrated in FIG. 4.

In FIG. 6, substrate 70 is flipped top over bottom with respect to its orientation in FIG. 5. Preferably, substrate 70 is flipped and placed on top of integrated circuit 10 so that top surface 32 of insulating layer 22 contacts top surface 72 of substrate 70. At this point, integrated circuit 10 and substrate 70 are in a face-to-face orientation and proper alignment is ensured. After alignment, integrated circuit 10 is bonded to substrate 70.

Preferably, wafer bonding is completed at room temperature and in a nitrogen (N2) ambient atmosphere. The wafer bonded is completed by atomic force. Preferably, lower temperatures are utilized during bonding so that the functionality of transistors 50 and 52 are not affected. In one embodiment, Smart-Cut® and Unibond® techniques can be utilized to bond substrate 70 to layer 22. Smart-Cut® and Unibond® techniques are discussed in "Smart-Cut®: The Basic Fabrication Process for UNIBOND® SOI Wafers," by Auberton-Herue, Bruel, Aspar, Maleville, and Moriceau (IEEE TRANS ELECTRON, March 1997), incorporated herein by reference. The Smart-Cut® and Unibond® techniques can also be utilized to form an SOI substrate for circuit 10 (substrate 18, layer 14 and substrate 12). The Smart-Cut® and Unibond® techniques can reach temperatures of 110° C. to bond layer 22 to substrate 70.

In summary, the Smart-Cut® and UNIBOND® techniques utilize a combination of hydrogen implantation and wafer bonding to form an SOI substrate. Applicant has modified the techniques to attach a silicon layer to an existing SOI substrate which includes a top insulating layer (e.g., layer 22). The wafers are cleaned utilizing a modified RCA cleaning and are bonded in hydrophilic conditions. The silicon substrate includes native oxide which, similar to the insulating layer forms OH-terminated surfaces after cleaning. Interactions between water absorbed on the surfaces causes the wafers to be bonded. Thermal treatments stabilize the bonding interface.

Figure 7:
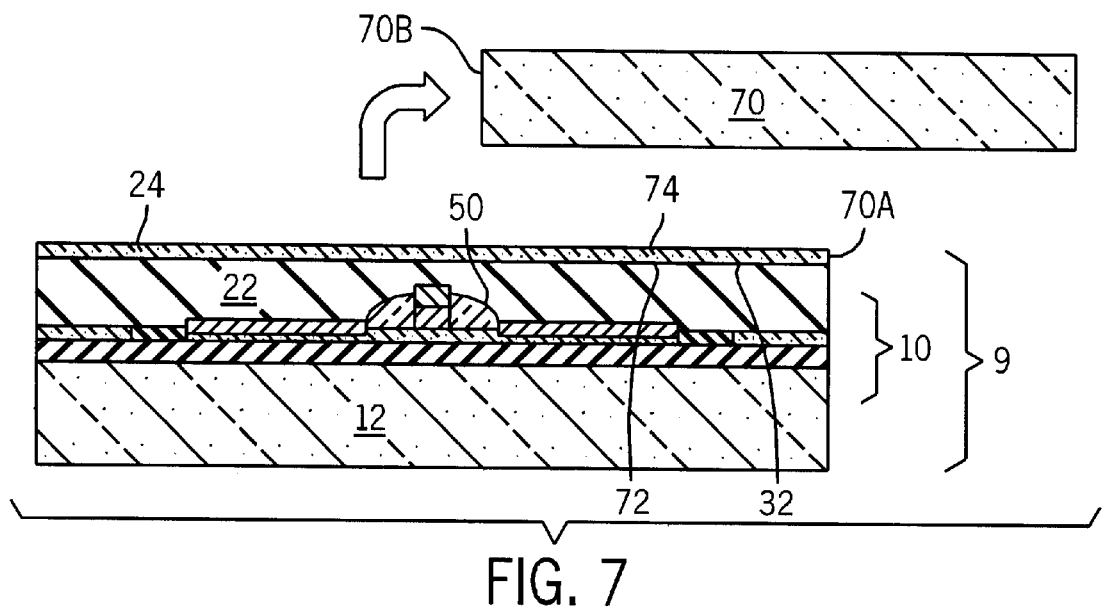
FIG. 7 is a cross-sectional view of the integrated circuit illustrated in FIG. 6, showing a substrate removal step.

In FIG. 7, after substrate 70 is bonded to integrated circuit 10, portion 70B of substrate 70 is removed leaving a portion 70A attached integrated circuit 10. Preferably, top surface 72 of portion 70A remains attached to top surface 72 of insulating layer 22. Portion 70A is associated with substrate 24. Preferably, portion 70B is removed from portion 70A by a mechanical force.

A mechanical process can be utilized to cleave portion 70A from portion 70B. The hydrogen rich layer associated with the hydrogen implant serves as a breaking interface at surface 74. Preferably, the removal process leaves a 200–800 angstrom thin film (portion 70A) of silicon on top of surface 32 of circuit 10.

In FIG. 1, conventional semiconductor processes are utilized to form transistors 52 and 54 on substrate 24 and complete integrated circuit 11. Various CMOS processes can be utilized to interconnect transistors 50, 52 and 54. After transistors 52 and 54 are formed, further deposition steps and etching and photolithography steps can be utilized to form other conductive semiconductive and insulative structures.

Figure 8:
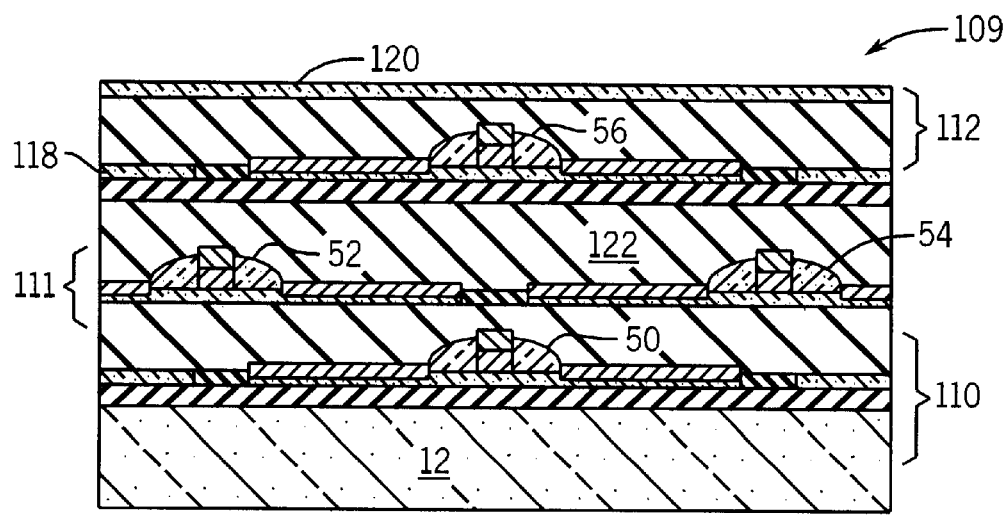
FIG. 8 is a cross-sectional view of an integrated circuit including three active layers in accordance with another exemplary embodiment.

With reference to FIG. 8, an integrated circuit 109 includes integrated circuits 110, 111 and 112. Integrated circuit 110 is similar to integrated circuit 10 discussed with reference to FIG. 1. Integrated circuit 111 is similar to integrated circuit 11 discussed with reference to FIG. 1. Integrated circuit 112 is also similar to integrated circuit 111 and is provided above integrated circuit 111 according to the same process steps discussed with reference to FIGS. 1–7. For example, an insulating layer 122 is deposited over transistors 52 and 54. A technique utilizing a substrate similar to substrate 70 is utilized to join the substrate to layer 122. The substrate is removed from layer 122 to leave an active layer or substrate. Substrate 118 is similar to substrate 18 (FIG. 1). A further layer 120 can be provided above integrated circuit 112. Therefore, FIG. 8 shows an integrated circuit 109 including three active layers.

The precise alignment of integrated circuits 10 and 11 may be necessary for proper operation of circuit 9. As wafer sizes become larger such as greater than 8 inches in diameter, alignment problems may become more difficult. Large pad interconnects may be utilized to couple elements of circuits 10 and 11.

In one aspect of the embodiment, transistor 50 has near ideal subthreshold voltage slope, low junction capacitance, an effective isolation as well as increased current density. Transistor 50 can have a non-floating (e.g., a biased) substrate to reduce floating substrate effects, such as, current and voltage kinks, thermal degradation, and large voltage variations.

The method of stacking floating gate FET structures increases packing density by allowing essentially unlimited vertical integrations. The vertical integrations are not limited by lithography considerations. A first SOI layer can be stacked and bonded to a second bulk-type substrate. The layers can be coupled by interlayer vias which extend into both layers.

It is understood that, while the detailed drawings and specific examples describe the exemplary embodiments of the present invention, they are there for the purpose of illustration only. The apparatus and method of the invention is not limited to the precise details, geometries, dimensions, materials, and conditions disclosed. For example, although particular layers are described as being particular sizes, other sizes can be utilized. Further still, although polysilicon is used as a gate conductor, other conductor materials can be utilized. Even further still, the drawings are not drawn to scale. Various changes can be made to the precise details discussed without departing from the spirit of the invention which is defined by the following claims.

What is claimed is:

1. An integrated circuit, comprising:
   a first semiconductor-on-insulator substrate including a first active layer and a first insulating layer, the first insulating layer being a buried insulating layer, the first active layer containing a first channel region between a pair of isolation structures and being a thin film having a thickness of less than 800 Angstroms, the isolation structures extending to a top surface of the first insulating layer, the first insulating layer being below the first active layer;

a second insulating layer above the first active layer of the first semiconductor-on-insulator substrate;

a second active layer containing a second channel region, the second active layer being attached to the second insulating layer by a bonding region, the second active layer being a thin film having a thickness of less than 800 Angstroms, the bonding region including a high density of OH bonding sites; and a third insulating layer above the second active layer.

2. The integrated circuit of claim 1, wherein the second active layer is formed from a bulk substrate.

3. The integrated circuit of claim 2, wherein the bulk substrate includes a hydrogen breaking interface.

4. The integrated circuit of claim 1 wherein the first active layer and the second active layer are each between 200 and 800 Angstroms thick.

5. The integrated circuit of claim 1 further comprising:

a third active layer attached to the third insulating layer.

6. The integrated circuit of claim 5 further comprising a fourth insulating layer disposed above the third active layer and a fourth active layer disposed above the third active layer.

7. The integrated circuit of claim 6, wherein the third and fourth active layers are formed from a bulk substrate.

8. A multilayer structure for containing a plurality of transistors, the multilayer structure comprising:

a first composite layer including a first semiconductor substrate, a buried oxide layer, a first active semiconductor layer, and a first insulating layer, the first semiconductor substrate being disposed below the buried oxide layer, the buried oxide layer being disposed below the first active layer, the first active layer being disposed below the first insulating layer and being a thin semiconductor film;

a bonding interface including OH bonding sites; and a second active layer bonded to the first insulating layer at the bonding interface.

9. The multilayer structure of claim 8, wherein a conductive via is disposed through the first insulating layer, the conductive via being electrically coupled to the first active layer and the second active layer.

10. The multilayer structure of claim 8 further comprising a second insulating layer disposed above the second active layer.

11. The multilayer structure of claim 10, wherein the second active layer is a portion of a bulk semiconductor substrate.

12. The multilayer structure of claim 8, wherein the first layer and the second active layer are bonded by an adhesive.

13. The multilayer structure of claim 9, wherein a metal layer is disposed over the second insulating layer.

14. A multilayer integrated circuit, comprising:

a first integrated circuit including a semiconductor-on-insulator layer including a first thin film active layer, a first insulating layer and a second insulating layer, the first active layer containing a first channel region, the first insulating layer being below the first thin film active layer, the first thin film active layer being below the second insulating layer;

a first bonding interface including OH bonding sites;

a second integrated circuit including a second thin film active layer containing a second channel region, the second thin film active layer being attached to the second insulating layer at the bonding interface; and a third insulating layer above the second active layer.

15. The multilayer integrated circuit of claim 14, wherein the second thin film active layer is formed from a bulk substrate.

16. The multilayer integrated circuit of claim 15, wherein the bulk substrate includes a hydrogen breaking interface.

17. The multilayer integrated circuit of claim 14 wherein the first thin film active layer and the second thin film active layer are each less than 800 A thick.

18. The integrated circuit of claim 14 further comprising:

a third integrated circuit including a third thin film active layer attached to the third insulating layer.

19. The integrated circuit of claim 18 further comprising a fourth insulating layer disposed above the third thin film active layer and a fourth active layer disposed above the third active layer.

20. The integrated circuit of claim 6, wherein the third and fourth thin film active layers are formed from a bulk substrate.

* * * * *